(12) United States Patent
Poley et al.

(10) Patent No.: US 11,740,106 B2
(45) Date of Patent: Aug. 29, 2023

(54) SINCOS ENCODER INTERFACE

(71) Applicant: TEXAS INSTRUMENTS INCORPORATED, Dallas, TX (US)

(72) Inventors: Richard Mark Poley, Sugarland, TX (US); Srinivasa Chakravarthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/054,949

(22) Filed: Nov. 14, 2022

(65) Prior Publication Data

US 2023/0072994 A1 Mar. 9, 2023

Related U.S. Application Data

(63) Continuation of application No. 17/355,248, filed on Jun. 23, 2021, now Pat. No. 11,499,847, which is a continuation of application No. 16/211,374, filed on Dec. 6, 2018, now Pat. No. 11,073,409.

(51) Int. Cl.
| | |
|---|---|
| *G01C 9/00* | (2006.01) |
| *G01D 5/245* | (2006.01) |
| *H02K 11/21* | (2016.01) |
| *H03M 1/12* | (2006.01) |
| *H03M 1/66* | (2006.01) |
| *H03M 1/22* | (2006.01) |

(Continued)

(52) U.S. Cl.
CPC ............. *G01D 5/245* (2013.01); *H02K 11/21* (2016.01); *H03M 1/12* (2013.01); *H03M 1/66* (2013.01); *G01D 5/02* (2013.01); *G01D 5/3473* (2013.01); *G01D 5/34753* (2013.01); *H03M 1/22* (2013.01)

(58) Field of Classification Search
CPC .......... G01D 5/245; G01D 5/02; H02K 11/21; H03M 1/12; H03M 1/66; H03M 1/22; G01C 9/00
See application file for complete search history.

(56) References Cited

U.S. PATENT DOCUMENTS

| | | | |
|---|---|---|---|
| 11,073,409 B2 | 7/2021 | Poley et al. | |
| 2007/0124014 A1* | 5/2007 | Kim ................... | G01D 5/24409 700/170 |

OTHER PUBLICATIONS

Texas Instruments, "C2000 Position Manager SinCos Library," User's Guide, Jan. 2016, 21 p.

(Continued)

*Primary Examiner* — Joseph J Lauture
(74) *Attorney, Agent, or Firm* — Krista Y. Chan; Frank D. Cimino

(57) ABSTRACT

In an example, a circuit includes a first comparator, a second comparator, a pulse counter, a processor, a first ADC, and a second ADC. The first comparator has a first input coupled to a first node, a second input, and an output. The second comparator has a first input coupled to a second node, a second input, and an output. A first DAC is coupled to the second input of the first comparator. A second DAC is coupled to the second input of the second comparator. The pulse counter has a first input coupled to the output of the first comparator and a second input coupled to the output of the second comparator. The first ADC has an input coupled to the first node and an output coupled to the processor. The second ADC has an input coupled to the second node and an output coupled to the processor.

20 Claims, 5 Drawing Sheets

(51) Int. Cl.
    *G01D 5/347*     (2006.01)
    *G01D 5/02*     (2006.01)

(56) References Cited

OTHER PUBLICATIONS

Texas Instruments, "Interface to SinCos Encoders with High-Resolution Position Interpolation," TI Designs, TIDUA05A-Jun. 2015-Revised Jul. 2015, 90 p.

Texas Instruments, "C2000 DesignDRIVE Software for Industrial Drives and Motor Control," 5 p. [Online] http:/www.ti.com/tool/DesignDRIVE?keyMatch=designDRIVE&tisearch=Search-EN-Everything.

\* cited by examiner

SINCOS ENCODER INTERFACE

CROSS-REFERENCE TO RELATED APPLICATIONS

This application is a continuation of U.S. patent application Ser. No. 17/355,248, filed on Jun. 23, 2021, which is a continuation of U.S. patent application Ser. No. 16/211,374, filed on Dec. 6, 2018 (now U.S. Pat. No. 11,073,409), both of which are incorporated herein by reference in their entirety.

SUMMARY

Some aspects of the present disclosure provide for a circuit. In an example, the circuit includes a first comparator, a second comparator, a first digital-to-analog converter (DAC), a second DAC, a pulse counter, a processor, a first analog-to-digital converter (ADC), and a second ADC. The first comparator has a first input coupled to a first node, a second input, and an output. The second comparator has a first input coupled to a second node, a second input, and an output. The first DAC has an output coupled to the second input of the first comparator. The second DAC has an output coupled to the second input of the second comparator. The pulse counter has a first input coupled to the output of the first comparator, a second input coupled to the output of the second comparator, and an output. The processor has a plurality of inputs and a plurality of outputs. The first ADC has an input coupled to the first node and an output coupled to a first of the plurality of inputs of the processor. The second ADC has an input coupled to the second node and an output coupled to a second one of the plurality of inputs of the processor.

Other aspects of the present disclosure provide for a circuit. In an example, the circuit consists essentially of a first comparator, a second comparator, a first DAC, a second DAC, a pulse counter, a processor, a first ADC, a second ADC, a third comparator, a third DAC, a third ADC, and a fourth ADC. The first comparator has a first input coupled to a first node, a second input, and an output. The second comparator has a first input coupled to a second node, a second input, and an output. The first DAC has an output coupled to the second input of the first comparator. The second DAC has an output coupled to the second input of the second comparator. The pulse counter has a first input coupled to the output of the first comparator, a second input coupled to the output of the second comparator, and an output. The processor has a plurality of inputs and a plurality of outputs. The first ADC has an input coupled to the first node and an output coupled to a first of the plurality of inputs of the processor. The second ADC has an input coupled to the second node and an output coupled to a second one of the plurality of inputs of the processor. The third comparator has a first input coupled to a third node, a second input, and an output coupled to a third input of the pulse counter. The third DAC has an output coupled to the second input of the third comparator. The third ADC has an input coupled to a fourth node and an output coupled to a third of the plurality of inputs of the processor. The fourth ADC has an input coupled to a fifth node and an output coupled to a fourth of the plurality of inputs of the processor.

Other aspects of the present disclosure provide for an electrical chip. In an example, the electrical chip consists essentially of a single circuit board and a single electrical chip package surrounding the single circuit board. In an example, the single circuit board consists essentially of a first comparator, a second comparator, a first DAC, a second DAC, a pulse counter, a processor, a first ADC, a second ADC, a third comparator, a third DAC, a third ADC, and a fourth ADC. The first comparator has a first input coupled to a first node, a second input, and an output. The second comparator has a first input coupled to a second node, a second input, and an output. The first DAC has an output coupled to the second input of the first comparator. The second DAC has an output coupled to the second input of the second comparator. The pulse counter has a first input coupled to the output of the first comparator, a second input coupled to the output of the second comparator, and an output. The processor has a plurality of inputs and a plurality of outputs. The first ADC has an input coupled to the first node and an output coupled to a first of the plurality of inputs of the processor. The second ADC has an input coupled to the second node and an output coupled to a second one of the plurality of inputs of the processor. The third comparator has a first input coupled to a third node, a second input, and an output coupled to a third input of the pulse counter. The third DAC has an output coupled to the second input of the third comparator. The third ADC has an input coupled to a fourth node and an output coupled to a third of the plurality of inputs of the processor. The fourth ADC has an input coupled to a fifth node and an output coupled to a fourth of the plurality of inputs of the processor.

BRIEF DESCRIPTION OF THE DRAWINGS

For a detailed description of various examples, reference will now be made to the accompanying drawings in which.

DETAILED DESCRIPTION

An encoder encodes the position of a rotary shaft and provides an output that may be used to track the position and/or rotational direction of the rotary shaft. A Sine-Cosine (SINCOS) encoder encodes the position of the rotary shaft based on two sine waves having a 90 degree phase shift (e.g., a sine wave and a cosine wave, where the cosine wave leads the sine wave by about one-quarter wavelength or 90 degrees). At least some SINCOS encoders are capable of providing both coarse and fine position information for the rotary shaft. For example, the coarse position information is provided by counting a number of zero crossings of the SINE wave and the fine (e.g., more precise) position information is provided by determining an arctangent of the sine wave and the cosine wave at a given point in time. At least some implementations of SINCOS encoders rely on a plurality of individual chips to provide both the coarse and the fine position information functionality. However, such implementations relying on a plurality of individual chips have certain characteristics that can limit their functionality. For example, some implementations can suffer from increased signal noise, complexity of implementation resulting from numerous board interconnects, and/or cost of implementation resulting from the manufacturing and operation of the plurality of individual chips.

At least some aspects of the present disclosure provide for a SINCOS encoder, capable of determining and providing both coarse and fine position information, implemented on a single die (e.g., a "single-chip" implementation). At least some examples of the SINCOS encoder include a plurality of analog-to-digital converters (ADCs), a plurality of comparators, and a pulse counter. At least some examples of the SINCOS encoder further include a digital-to-analog converter (DAC) and a microprocessor or other form of processing logic, for example, for processing an output of the ADCs. In some examples, the ADCs are each 16-bit resolution ADCs, while in other examples the ADCs have any suitable resolution selected according to a desired application use case for the SINCOS encoder.

Figure 1:
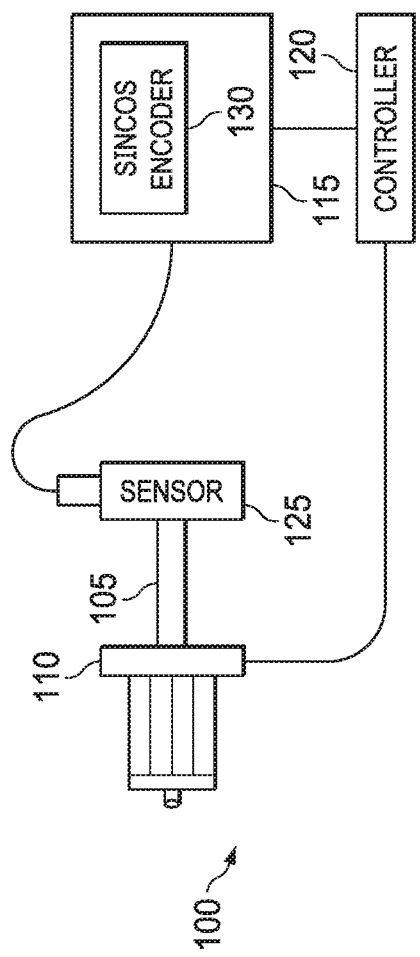
FIG. 1 shows a block diagram of an illustrative rotary system in accordance with various examples.

Turning now to FIG. 1, a block diagram of a rotary system 100 is shown. In at least some examples, the system 100 is representative of any environment in which a rotary shaft is turned rotationally and a position of the rotary shaft is determined, tracked, and/or measured. In some examples, the system 100 includes a rotary shaft 105, a motor 110, an encoder 115, and a controller 120. The motor 110 is coupled to the rotary shaft 105 and configured to rotationally manipulate the rotary shaft 105. For example, in various implementations the motor 110 and the rotary shaft 105 may each be components of a computer-controlled manufacturing device (e.g., such as a computer-controlled mill, lathe, cutter, welder, painter, etc.), a robotic arm, an automatic assembly device, a three-dimensional (3D) printer, a computer-controller engraver, an autonomous vehicle, a drone, a servo motor, etc. In some examples, the encoder 115 couples (e.g., mounts) to the motor 110 or to another device located proximate to the rotary shaft 105 such that after the coupling, the encoder 115 is positioned proximate to the rotary shaft 105. In other examples, the encoder 115 is not located proximate to the rotary shaft 105 but is communicatively coupled to a sensor 125 located proximate to the rotary shaft 105. In at least some examples, as the rotary shaft 105 turns, the encoder 115 obtains data by monitoring the rotary shaft 105 (e.g., monitoring markings on the rotary shaft 105 itself and/or markings on a component (such as a disc) coupled to the rotary shaft 105). The data, in at least some examples, takes the form of sinusoidal waveforms such as a sine wave and a cosine wave. In various examples, the encoder 115 obtains the data from a sensor 125, such as an optical sensor, an inductive sensor, a magnetic sensor, or any other suitable sensor included in, or coupled to, the encoder 115. The sensor 125, in some examples, monitors markings, protrusions, or other physical characteristics of the rotary shaft 105 to monitor relative and/or absolute position of the rotary shaft 105.

In at least some examples, the sensor 125 provides the sine wave and the cosine wave to a SINCOS encoder 130 of the encoder 115. The SINCOS encoder 130 receives the sine and cosine waves and, in some examples, determines coarse and fine position information of the rotary shaft 105 based on the received sine and cosine waves. In at least one example, the sine and cosine waves are each compared to a reference signal (e.g., by comparators (not shown) of the SINCOS encoder 130) to generate a pair of square waves (e.g., a pulse train or pulse wave). Rising edges of the square waves are then counted by a pulse counter (not shown) of the SINCOS encoder 130 to determine coarse position information of the rotary shaft 105. In addition, the sine and cosine waves are each converted to digital signals (e.g., by ADCs (not shown) of the SINCOS encoder 130) from which an arctangent value is calculated (e.g., by a processor (not shown) of the SINCOS encoder 130) to determine fine position information of the rotary shaft 105. In at least some examples, the SINCOS encoder 130 subsequently outputs the coarse position information and the fine position information for the encoder 115 to provide to the controller 120 for, in at least some examples, controlling the motor 110.

Figure 2:
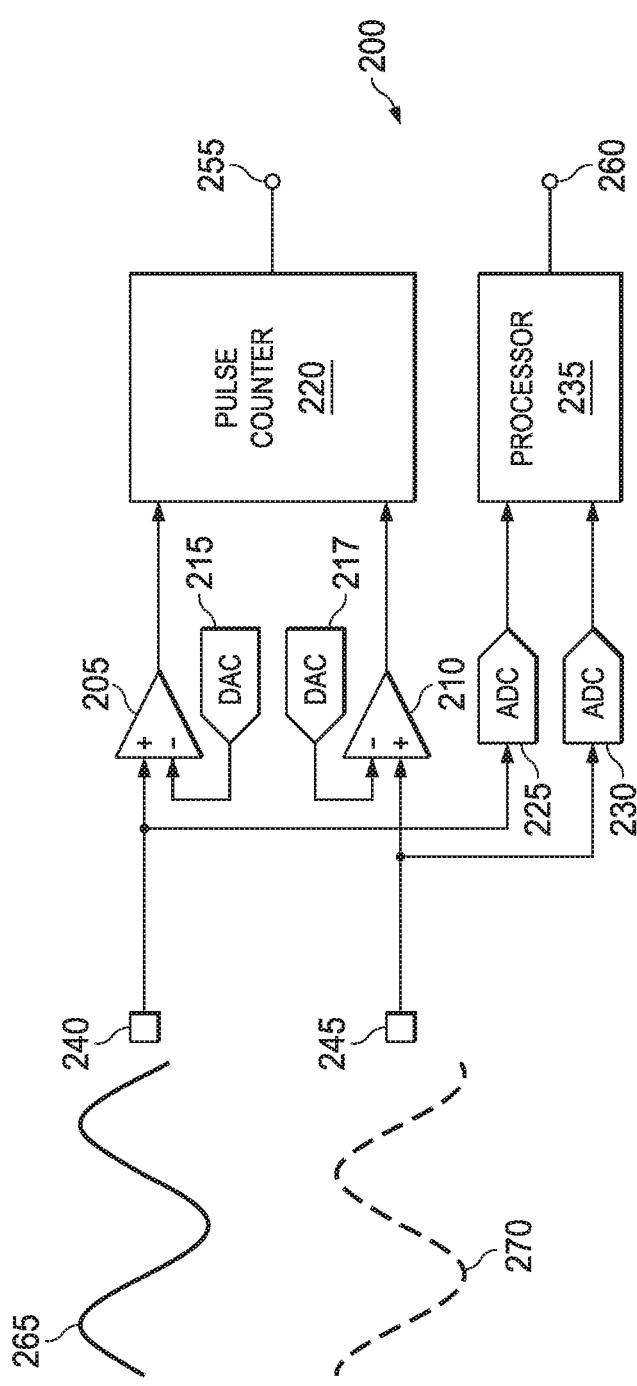
FIG. 2 shows a schematic diagram of an illustrative circuit in accordance with various examples.

Turning now to FIG. 2, a block diagram of an illustrative circuit 200 is shown. In at least some examples, the circuit 200 is a SINCOS encoder, such that the circuit 200 is suitable for implementation as the SINCOS encoder 130 of the system 100 of FIG. 1. In at least some examples, the components of the circuit 200 are implemented as a single chip (e.g., housed within a common chip-package, implemented on a same die, etc.). Implementing all components of the circuit 200 as a single chip (e.g., as opposed to implementing a first portion of the components of the circuit 200 as one chip and implementing a second portion of the components of the circuit 200 as a second chip that couples to the first chip), in at least some examples, brings advantages to the circuit 200. In various examples and implementation or application environments, the advantages include at least reduced delay between signal (e.g., such that components of the circuit 200 receiving a same input signal receive the input signal substantially simultaneously as opposed to consecutively, as is the case in some examples of a plurality of chips coupled together via interconnects that can introduce propagation delays into signals), reduced signal noise in signals of the circuit 200, reduced signal losses resulting from the use of interconnects between separate chips, etc.

At least one example architecture of the circuit 200 includes a comparator 205, a comparator 210, a DAC 215, a DAC 217, a pulse counter 220, an ADC 225, an ADC 230, and a processor 235. The comparator 205 has a first input coupled to a node 240 and a second input coupled to an output of the DAC 215. The comparator 210 has a first input coupled to a node 245 and a second input coupled to an output of the DAC 217. An output of the comparator 205 is coupled to a first input of the pulse counter 220 and an output of the comparator 210 is coupled to a second input of the pulse counter 220. An input of the ADC 225 is coupled to the node 240 and an input of the ADC 230 is coupled to the node 245. An output of the ADC 225 is coupled to the processor 235 and an output of the ADC 230 is coupled to the processor 235. An output of the processor 235 is coupled to a node 260. In at least some examples, the circuit 200 is configured to receive input signals at node 240 and node 245 (e.g., receive a sine wave as discussed herein at node 240 and receive a cosine wave as discussed herein at node 245). The circuit 200 is further configured to provide output signals at node 255 and node 260 (e.g., provide an output indicating coarse position information at node 255 and an output indicating fine position information at node 260). In at least some examples, the DAC 215 and the DAC 217 each have inputs coupled to a controller, processor, respective registers, or any other suitable source of data such that each of the DAC 215 and DAC 217 are capable of receiving data values independently of one another.

In at least one example of operation of the circuit 200, input signals are received at the node 240 and the node 245. The input signal received at the node 240 is, for example, an analog signal substantially comprising a sine wave and the input signal received at the node 245 is, for example, an analog signal substantially comprising a cosine wave. In at least some examples, the input received at node 240 and the input received at node 245 have a relationship, for example, such that they each result from a same sensor and the input received at the node 245 leads the input received at the node 240 by approximately 90 degrees. In various examples, the input signals are received from a sensor, from an amplifier (e.g., such as an instrumentation amplifier) that amplified a sensor output (e.g., such as differential output signals of a sensor) to form the input signals, or from any other suitable source.

The input signal received at node 240 (referred to hereafter as the sine wave 265) is provided to the comparator 205 at the first input of the comparator 205. A compensation signal is provided, in some examples, to the second input of the comparator 205. In at least some examples, the sine wave 265 includes a DC offset such that a zero crossing of the sine wave 265 is not located at one-half of a period of the sine wave 265. The DC offset, if left uncompensated for, can cause a duty cycle of a square wave output of the comparator 205 to have a duty cycle of a value other than fifty percent. Accordingly, the compensation signal is, for example, an analog signal output of the DAC 215 that compensates for the DC offset of the sine wave 265 (e.g., such that an output of the comparator 205 has an approximately fifty percent duty cycle). In various examples, the DAC 215 generates the compensation signal according to a digital value input to the DAC 215. The digital value input is, for example, obtained from a controller (not shown), a register (not shown), or any other suitable source capable of providing a digital value to the DAC 215 for conversion to an analog signal. Accordingly, in some examples (such as when the sine wave 265 has approximately no DC offset) the digital value input, and therefore the compensation signal, has a value of approximately zero. In other examples (such as when the sine wave 265 has a non-zero DC offset), the digital value input has a value such that the compensation signal has a value approximately equal to the DC offset of the sine wave 265, thereby substantially negating an effect of the DC offset of the sine wave 265 on an output of the comparator 205.

The input signal received at node 245 (referred to hereafter as the cosine wave 270) is provided to the comparator 210 at the first input of the comparator 210. A compensation signal is provided, in some examples, to the second input of the comparator 210. In at least some examples, the cosine wave 270 includes a DC offset such that a zero crossing of the cosine wave 270 is not located at one-half of a period of the cosine wave 270. The DC offset, if left uncompensated for, can cause a duty cycle of a square wave output of the comparator 210 to have a duty cycle of a value other than fifty percent. Accordingly, the compensation signal is, for example, an analog signal output of the DAC 217 that compensates for the DC offset of the cosine wave 270 (e.g., such that an output of the comparator 210 has an approximately fifty percent duty cycle). In various examples, the DAC 217 generates the compensation signal according to a digital value input to the DAC 217. The digital value input is, for example, obtained from a controller (not shown), a register (not shown), or any other suitable source capable of providing a digital value to the DAC 217 for conversion to an analog signal. Accordingly, in some examples (such as when the cosine wave 270 has approximately no DC offset) the digital value input, and therefore the compensation signal, has a value of approximately zero. In other examples (such as when the cosine wave 270 has a non-zero DC offset), the digital value input has a value such that the compensation signal has a value approximately equal to the DC offset of the cosine wave 270, thereby substantially negating an effect of the DC offset of the cosine wave 270 on an output of the comparator 210.

As discussed above, in at least some examples the comparator 205 converts the sine wave 265 to a square wave with an approximately fifty percent duty cycle and the comparator 210 converts the cosine wave 270 to another square wave with an approximately fifty percent duty cycle. Each square wave is provided by the comparator 205 and the comparator 210, respectively, to the pulse counter 220. The pulse counter 220 is, in at least some examples, a quadrature pulse encoder that counts a number of rising edges to determine and output coarse (e.g., approximate) position of a rotary shaft. For example, each pulse or rising edge counted by the pulse counter 220, in some examples, corresponds to the passing of a marked location of the rotary shaft by a sensor from which the sine wave 265 and the cosine wave 270 originate (either directly, or prior to amplification as discussed above) such that counting a number of pulses indicates a number of marked locations of the rotary shaft that have passed by the sensor and therefore a coarse position of the rotary shaft relative to a position of the rotary shaft when it began rotating.

In some examples the sine wave 265 is further provided to the ADC 225 and the cosine wave 270 is further provided to the ADC 230. The ADC 225 samples the sine wave 265, converting the sine wave 265 to a digital signal and the ADC 230 samples the cosine wave 270, converting the cosine wave 270 to another digital signal. Each digital signal is provided by the ADC 225 and the ADC 230, respectively, to the processor 235. The processor 235 is, in various examples, any processor, microprocessor, or other element having processing capabilities suitable for performing mathematical calculation. The processor 235 receives the digital signals from the ADC 225 and the ADC 230 and calculates an arctangent based on the sine wave 265 and the cosine wave 270. For example, the processor 235 divides the digital signal received from the ADC 225 by the digital signal received from the ADC 230, where the resulting value is an arctangent calculation that indicates fine position information of the rotary shaft.

In at least some examples, a device (not shown) coupled to the circuit 200 (such as the controller 120 of the rotary system 100 of FIG. 1) receives both the coarse position information from the pulse counter 220 and the fine position information from the processor 235. In certain circumstances, the device may prefer to use one of the coarse information or the fine information. For example, when the rotary shaft is rotating at high speeds, the device may use the coarse position information for position related actions. In at least some examples, when the rotational speed of the rotary shaft is sufficiently large, the ADC 225 and the ADC 230 may not be capable of sampling at a high enough frequency to produce accurate fine position information. In such circumstances, the device may rely on the coarse position information. In circumstances in which the rotational speed of the rotary shaft is such that the ADC 225 and the ADC 230 are capable of sampling at a high enough frequency to produce accurate fine position information, the device may rely on the fine position information in place of, or in addition to, the coarse position information. In at least some examples, high speed and low speed as used herein are relative based on a sampling rate of the ADC 225 and the ADC 230. As one example, for a 1,024 line encoder (e.g., such that in one full motor revolution the output of the comparator 205 and/or the comparator 210 includes about 1,024 pulses) with a sample rate of the ADC 225 and the ADC 230 of 10 kilohertz (kHz), fine position information may be used at rotary shaft rotational speeds of less than or equal to about 18 revolutions per minute (rpm) and the coarse position information may be used at rotational speeds of the rotary shaft greater than 18 rpm (e.g., when the fine position information begins to lose accuracy as a result of the sampling rate of ADC 225 and ADC 230 in combination with the rotational speed of the rotary shaft).

Figure 3:
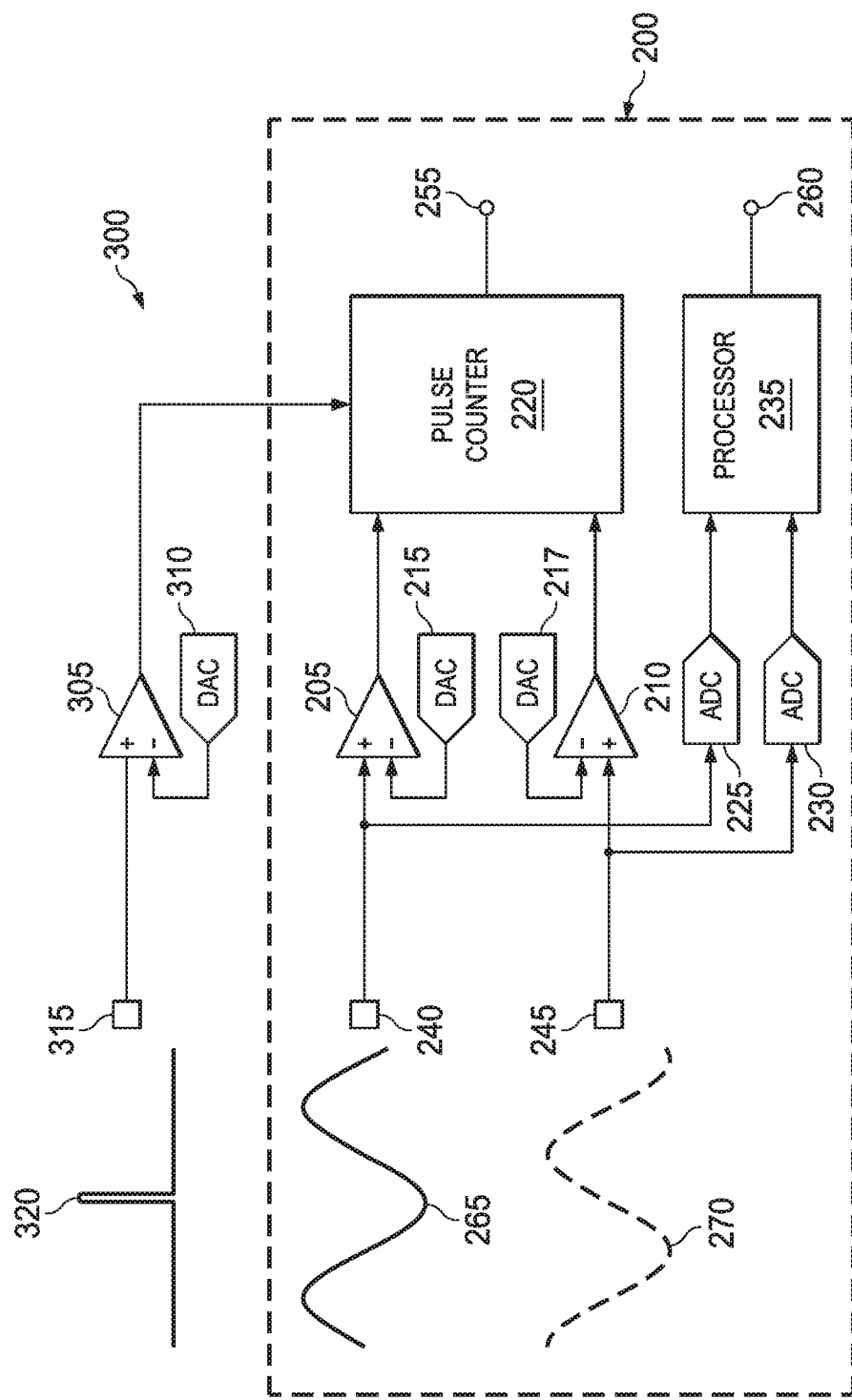
FIG. 3 shows a schematic diagram of an illustrative circuit in accordance with various examples.

Turning now to FIG. 3, a block diagram of an illustrative circuit 300 is shown. In at least some examples, the circuit 300 is a SINCOS encoder, such that the circuit 300 is suitable for implementation as the SINCOS encoder 130 of the system 100 of FIG. 1. In at least some examples, the components of the circuit 300 are implemented as a single chip (e.g., housed within a common chip-package, implemented on a same die, etc.). Implementing all components of the circuit 300 as a single chip (e.g., as opposed to implementing a first portion of the components of the circuit 300 as one chip and implementing a second portion of the components of the circuit 300 as a second chip that couples to the first chip), in at least some examples, brings advantages to the circuit 300. In various examples and implementation or application environments, the advantages include at least reduced delay between signal (e.g., such that components of the circuit 300 receiving a same input signal receive the input signal substantially simultaneously as opposed to consecutively, as is the case in some examples of a plurality of chips coupled together via interconnects that can introduce propagation delays into signals), reduced signal noise in signals of the circuit 300, reduced signal losses resulting from the use of interconnects between separate chips, etc. In at least some examples, the circuit 300 comprises the circuit 200, with the addition of a comparator 305 and a DAC 310. A description of components of the circuit 200 is not repeated herein, but reference may be made to the discussion of FIG. 2 for an understanding of their operation.

In at least one example architecture, a first input of the comparator 305 is coupled to a node 315 and a second input of the comparator 305 is coupled to an output of the DAC 310. In at least some examples, the DAC 310 has an input coupled to a controller, processor, register, or any other suitable source of data such that the DAC 310 is capable of receiving a data value. In at least some examples, the DAC 310 is configured to generate a compensation signal for a signal present at node 315 based on the data value in substantially the same manner and under conditions substantially the same as the DAC 215 and/or the DAC 217 when discussed with respect to the sine wave 265 and/or the cosine wave 270, respectively.

In an example of operation of the circuit 300, an index signal 320 is received at the node 315. The index signal 320 is, in at least some examples, is a signal provided to indicate that the rotary shaft has rotated beyond a home or reset position. In some examples, while the circuit 200 provides coarse position information relative to a location of the rotary shaft when the circuit 200 begins operating, the circuit 300 provides coarse position information with respect to the home position of the rotary shaft (after the rotary shaft has rotated a sufficient amount to pass the home position at least one time after the circuit 300 begins operating). For example, in at least one implementation of the circuit 300, the index signal 320 has a value of substantially zero for all times other than when the rotary shaft rotates past the home position. When the rotary shaft rotates past the home location, a pulse appears in the index signal 320. The comparator 305 converts the index signal 320 into a square wave such that a rising edge of the square wave indicates passage of the rotary shaft past the home position and the square wave includes exactly one rising edge and one falling edge per complete mechanical revolution of the rotary shaft. In at least some examples, the comparator 305 provides the square wave to the pulse counter 220. The pulse counter 220, in some examples, resets a count of pulses counted from the outputs of the comparator 205 and the comparator 210 for each received rising edge of the square wave output by the comparator 305. In some examples, the pulse counter 220 counts each rising edge of the square wave output by the comparator 305 to track a number of revolutions of the rotary shaft, while in other examples the pulse counter 220 discards the rising edge of the square wave output by the comparator 305 after resetting the count of pulses counted from the outputs of the comparator 205 and the comparator 210.

Figure 4:
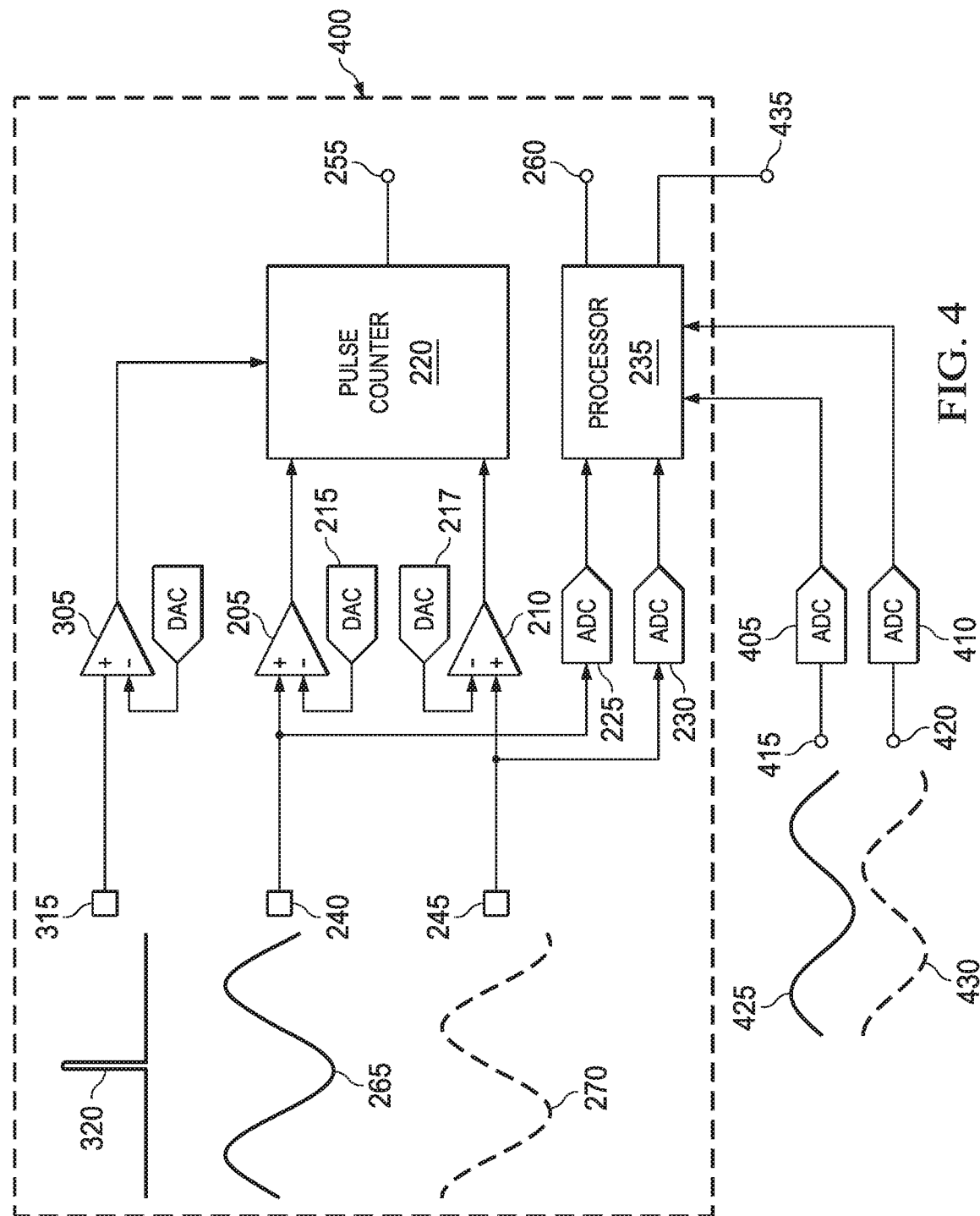
FIG. 4 shows a schematic diagram of an illustrative circuit in accordance with various examples.

Turning now to FIG. 4, a block diagram of an illustrative circuit 400 is shown. In at least some examples, the circuit 400 is a SINCOS encoder, such that the circuit 300 is suitable for implementation as the SINCOS encoder 130 of the system 100 of FIG. 1. In at least some examples, the components of the circuit 400 are implemented as a single chip (e.g., housed within a common chip-package, implemented on a same die, etc.). Implementing all components of the circuit 400 as a single chip (e.g., as opposed to implementing a first portion of the components of the circuit 400 as one chip and implementing a second portion of the components of the circuit 400 as a second chip that couples to the first chip), in at least some examples, brings advantages to the circuit 300. In various examples and implementation or application environments, the advantages include at least reduced delay between signal (e.g., such that components of the circuit 400 receiving a same input signal receive the input signal substantially simultaneously as opposed to consecutively, as is the case in some examples of a plurality of chips coupled together via interconnects that can introduce propagation delays into signals), reduced signal noise in signals of the circuit 400, reduced signal losses resulting from the use of interconnects between separate chips, etc. In at least some examples, the circuit 400 comprises the circuit 300, with the addition of an ADC 405 and an ADC 410. A description of components of the circuit 300 is not repeated herein, but reference may be made to the discussion of FIG. 3 for an understanding of their operation. In an alternative example, although not shown, the circuit 400 comprises the circuit 200, with the addition of the ADC 405 and the ADC 410. Such a circuit is obtained by omitting the comparator 305, DAC 310, node 315, and index signal 320 from the circuit 300.

In at least one example architecture, an input of the ADC 405 is coupled to a node 415 and an input of the ADC 410 is coupled to a node 420. An output of the ADC 405 is coupled to the processor 235 and an output of the ADC 410 is coupled to the processor 235. In an example of operation of the circuit 400, a sine wave 425 is received at the node 415 and a cosine wave 430 is received at the node 420. The ADC 405 samples the sine wave 425, converting the sine wave 425 to a digital signal and the ADC 410 samples the cosine wave 430, converting the cosine wave 430 to another digital signal. Each digital signal is provided by the ADC 405 and the ADC 410, respectively, to the processor 235. The processor 235 receives the digital signals from the ADC 405 and the ADC 410 and calculates an arctangent based on the sine wave 425 and the cosine wave 430. For example, the processor 235 divides the digital signal received from the ADC 405 by the digital signal received from the ADC 410, where the resulting value is an arctangent calculation that indicates position information of the rotary shaft via a value provided to a node 435. In at least some examples, the position information obtained based on the sine wave 425 and the cosine wave 430, in some examples, is referred to as absolute position information. For example, the absolute position information indicates an absolute position of the rotary shaft within one mechanical revolution, in contrast to the relative position discussed previously. Absolute position information is in contrast to relative position information (such as the coarse position information and the fine position information, discussed herein), in which the measurement is relative to some datum (such as the index or home location, discussed herein). In at least some examples, the datum is not known until a signal corresponding to the datum has been received, causing inaccuracy or ambiguity in relative position information. However, in at least some examples, absolute position measurement is available (e.g., substantially accurate and/or definite) at times during which the relative position information is inaccurate or ambiguous. In at least some examples, to enable determination of the absolute position information, the sine wave 425 and the cosine wave 430 have an electrical frequency substantially the same as a mechanical frequency of the rotary shaft. For example, for every one revolution of the rotary shaft, both the sine wave 425 and the cosine wave 430 go through one complete cycle (e.g., one period of the sine wave 425 and cosine wave 430 per revolution of the rotary shaft).

Figure 5:
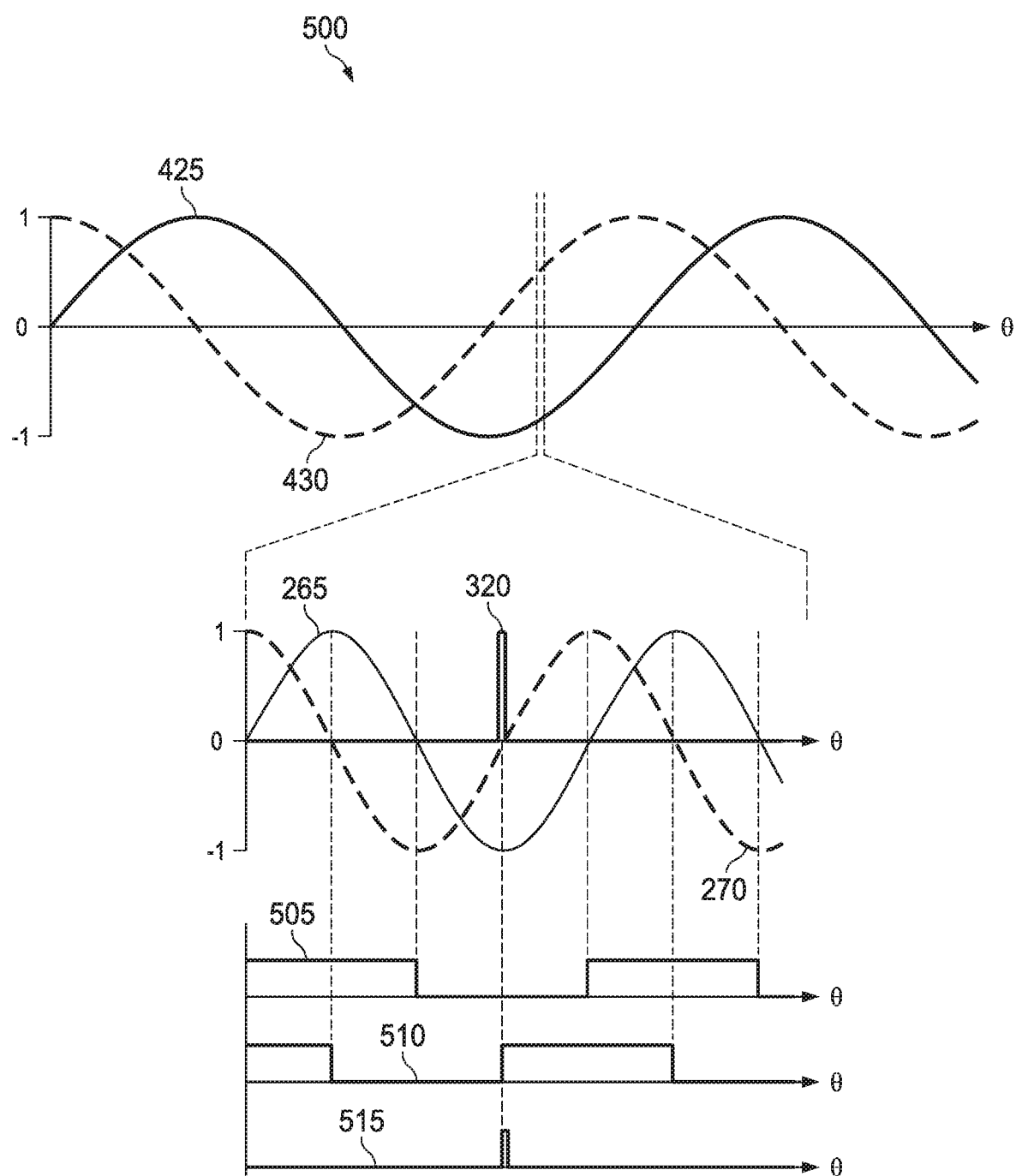
FIG. 5 shows a diagram of illustrative signal waveforms.
Figure 6:
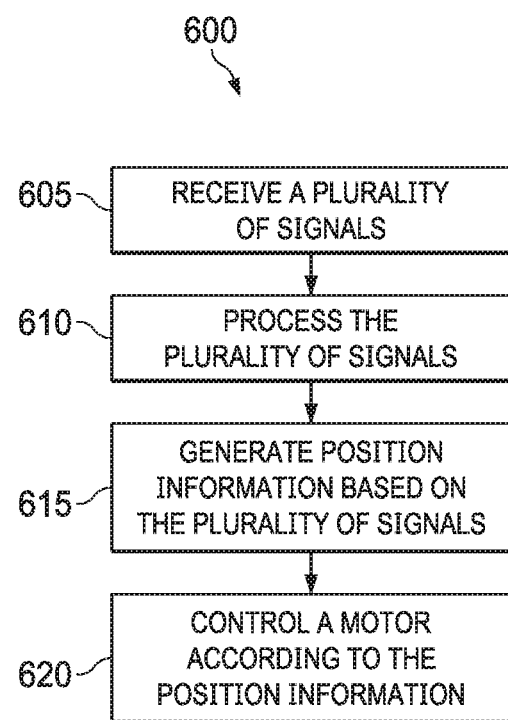
FIG. 6 shows a flowchart of an illustrative method in accordance with various examples.

Turning now to FIG. 5, a diagram 500 of illustrative signal waveforms is shown. In at least some examples, the diagram 500 is representative of at least some waveforms present in the circuit 200, discussed above with respect to FIG. 2, at least some waveforms present in the circuit 300, discussed above with respect to FIG. 3, and/or at least some waveforms present in the circuit 400, discussed above with respect to FIG. 4, and reference is made in FIG. 5 to the elements of other figures herein. For example, the diagram 500 illustrates the sine wave 265, the cosine wave 270, the index signal 320, the sine wave 425, and the cosine wave 430. In at least some further examples, the signal 505 is representative of the output of the comparator 205, the signal 510 is representative of the output of the comparator 210, and the signal 515 is representative of the output of the comparator 305. Turning now to FIG. 6, a flowchart of an illustrative method 600 is shown. The method 600 is implemented, in some examples, by a circuit such as the circuit 200, circuit 300, and/or circuit 400, discussed above. In some examples, the method 600 enables a single circuit contained on a single die and within a single chip to determine coarse position information and fine position information for a rotational element, such as a rotational shaft coupled directly or indirectly to a motor that causes the rotational element to rotate.

At operation 605, a plurality of signals are received. In at least one example, the plurality of signals include a first sine wave and a first cosine wave having a period determined according a speed of rotation of the rotational element. In other examples, the plurality of signals further includes an index signal. In yet other examples, the plurality of signals further includes a second sine wave and a second cosine wave. The plurality of signals are received, in various examples, from one or more sensors (e.g., such as optical and/or magnetic sensors) configured and positioned such that they monitor rotation of the rotational element. In at least some examples, the first sine wave and the first cosine wave correspond to divisional markings associated with, and coupled to, the rotational element rotating past one of the sensors. The index signal indicates an index or home marking associated with, and coupled to, the rotational element rotating past one of the sensors. The second sine wave and the second cosine wave indicate an absolute rotation of the rotational element (e.g., such that the second sine wave and the second cosine wave each go through one full period for each full revolution of the rotational element).

At operation 610, the plurality of signals is processed. For example, when the plurality of signals include the first sine wave and the first cosine wave, the plurality of signals is processed by providing the first sine wave to a first comparator and a first ADC and then providing the first cosine wave to a second comparator and a second ADC. The first comparator generates a first square wave based on the first sine wave and the first ADC samples the sine wave to generate a first digital value. The second comparator generates a second square wave based on the first cosine wave and the second ADC samples the cosine wave to generate a second digital value.

When the plurality of signals further includes the index signal, the plurality of signals is further processed by providing the index signal to a third comparator. The third comparator generates a third square wave based on the index signal.

When the plurality of signals further includes the second sine wave and the second cosine wave, the plurality of signals is further processed by providing the second sine wave to a third ADC and providing the second cosine wave to a fourth ADC. The third ADC samples the second sine wave to generate a third digital value and the fourth ADC samples the second cosine wave to generate a fourth digital value.

At operation 615, position information is generated based on the plurality of signals. For example, when the plurality of signals includes the first sine wave and the first cosine wave, the position information is generated by a pulse counter counting pulses present in the output of the first comparator and the second comparator to generate coarse position information and by a processor performing an arctangent computation by dividing the first digital value by the second digital value to generate fine position information. In at least some examples, when the plurality of signals includes only the first sine wave and the first cosine wave, the coarse position information is relative to a position of the rotational element when the method 600 begins.

When the plurality of signals further includes the index signal, the position information is generated by the pulse counter resetting a count of pulses present in the output of the first comparator and the second comparator each time a pulse is received in the output of the third comparator to generate coarse position information. A processor performs an arctangent computation by dividing the first digital value by the second digital value to generate fine position information. In at least some examples, when the plurality of signals includes only the first sine wave, the first cosine wave, and the index, the coarse position information is relative to a position of the rotational element when the method 600 begins and until a first pulse in the output of the third comparator and is relative to the index or home location of the rotational element after the first pulse in the output of the third comparator.

When the plurality of signals further includes the second sine wave and the second cosine wave, the position information is generated as when the plurality of signals includes the first sine wave, the first cosine wave, and the index signal, with the addition of generation of absolute position information. In at least one example, the processor performs an arctangent operation by dividing the third digital value by the fourth digital value to generate the absolute position information.

At operation 620, a motor is controlled according to the generated position information. The motor is controlled, in at least some examples, by providing the generated position information to a controller configured to control operation of the motor. Controllable aspects of the motor include at least speed of rotation of the rotational element, a number of revolutions of the rotational element, and/or a distance (e.g., angle) of rotation of the rotational element. The motor is controlled according to the generated position information, in at least some examples, to precisely position the rotational element in a desired position based on the generated position information.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), metal oxide semiconductor FET (MOSFET), n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A system, comprising:
   a rotary shaft;
   a motor coupled to the rotary shaft;
   a controller coupled to the motor;
   an encoder coupled to the motor and to the controller, the encoder comprising:
      a first comparator having a first input, a second input, and an output;
      a second comparator having a first input, a second input, and an output;
      a first digital-to-analog converter (DAC) coupled to the first input of the first comparator;
      a second DAC coupled to the first input of the second comparator;
      a pulse counter coupled to the output of the first comparator and to the output of the second comparator;
      a processor having a first input and a second input;
      a first analog-to-digital converter (ADC) coupled to the first input of the processor and to the second input of the first comparator; and
      a second ADC coupled to the second input of the processor and to the second input of the second comparator.

2. The system of claim 1, wherein a first sine wave is received at the first input of the first comparator and at an input of the first ADC;
   wherein a first cosine wave is received at the first input of the second comparator and at an input of the second ADC;
   wherein the first comparator is configured to convert the first sine wave into a first square wave, and the second comparator is configured to convert the first cosine wave into a second square wave;
   wherein the first ADC is configured to convert the first sine wave into a first digital value; and
   wherein the second ADC is configured to convert the first cosine wave to a second digital value.

3. The system of claim 2, wherein the pulse counter is configured to count a number of rising edges of the first square wave and the second square wave to determine coarse position information, and wherein the processor is configured to generate fine position information based at least partially on the first digital value and the second digital value.

4. The system of claim 1, further comprising:
   a third comparator having a first input, a second input, and an output coupled to a third input of the pulse counter; and
   a third DAC having an output coupled to the second input of the third comparator.

5. The system of claim 4, wherein the first DAC, the second DAC, and the third DAC are configured to receive separate digital values configured to compensate for direct current (DC) bias.

6. The system of claim 4, wherein the third comparator is configured to:
receive an index signal at the first input of the third comparator; and
convert the index signal to a third square wave,
wherein the pulse counter is configured to reset a count each time a rising edge of the third square wave is received.

7. The system of claim 1, further comprising:
a third ADC coupled to the processor; and
a fourth ADC coupled to the processor.

8. The system of claim 7, wherein the third ADC is configured to receive a second sine wave and to convert the second sine wave to a third digital value, and wherein the fourth ADC is configured to receive a second cosine wave and to convert the second cosine wave to a fourth digital value.

9. The system of claim 8, wherein the processor is configured to generate absolute position information based at least partially on the third digital value and the fourth digital value.

10. A method, comprising:
receiving a plurality of signals, including a first sine wave and a first cosine wave;
processing the plurality of signals by:
providing the first sine wave to a first input of a first comparator and to a first analog-to-digital converter (ADC), the first comparator having a second input coupled to a first digital-to-analog converter (DAC);
providing the first cosine wave to a first input of a second comparator and to a second ADC, the second comparator having a second input coupled to a second DAC;
generating a first square wave based on the first sine wave;
sampling the first sine wave to generate a first digital value;
generating a second square wave based on the first cosine wave; and
sampling the first cosine wave to generate a second digital value;
generating position information based on the plurality of signals by:
determining a number of pulses present at an output of the first comparator and at an output of the second comparator; and
performing a first arctangent computation by dividing the first digital value by the second digital value; and
transmitting the generated position information to a controller configured to control operation of a motor.

11. The method of claim 10, wherein the plurality of signals further comprising: a second sine wave and a second cosine wave.

12. The method of claim 11, wherein the second sine wave and the second cosine wave indicate an absolute rotation of a rotary shaft coupled to the motor.

13. The method of claim 11, further comprising:
providing the second sine wave to a third ADC;
providing the second cosine wave to a fourth ADC;
sampling the second sine wave to generate a third digital value; and
sampling the second cosine wave to generate a fourth digital value.

14. The method of claim 13, wherein generating position information based on the plurality of signals further comprising performing a second arctangent computation by dividing the third digital value by the fourth digital value to generate absolute position information.

15. The method of claim 10, wherein receiving the plurality of signals comprises receiving the plurality of signals from one or more sensors configured and positioned to monitor rotation of a rotary shaft coupled to the motor.

16. The method of claim 10, wherein the first sine wave and the first cosine wave comprise a period determined according a speed of rotation of a rotary shaft coupled to the motor.

17. The method of claim 10, further comprising:
providing an index signal to a third comparator, wherein the plurality of signals further includes the index signal; and
generating a third square wave based on the index signal.

18. The method of claim 17, wherein generating the position information comprises:
resetting a count of pulses present at the output of the first comparator and at the output of the second comparator each time a pulse is received at the output of the third comparator.

19. The method of claim 17, wherein determining a number of pulses present at an output of the first comparator and at an output of the second comparator generates coarse position information;
wherein the coarse position information is relative to a first position of a rotary shaft coupled to the motor until a first pulse at the output of the third comparator; and
wherein the coarse position information is relative to a second position of the rotary shaft after the first pulse.

20. The method of claim 10, wherein determining a number of pulses present at an output of the first comparator and at an output of the second comparator generates coarse position information, and the coarse position information is relative to a position of a rotary shaft coupled to the motor.

* * * * *